United States Patent
Yu et al.

(10) Patent No.: US 11,144,697 B1
(45) Date of Patent: Oct. 12, 2021

(54) PROCESSING METHOD FOR APPLYING ANALOG DYNAMIC CIRCUIT TO DIGITAL TESTING TOOL

(71) Applicant: RDC Semiconductor Co., Ltd., Hsinchu (TW)

(72) Inventors: Hsin-Hsiung Yu, Hsinchu (TW); Ching-Chong Chuang, Hsinchu (TW); Chung-Ching Tseng, Hsinchu (TW)

(73) Assignee: RDC SEMICONDUCTOR CO., LTD., Hsinchu (TW)

( * ) Notice: Subject to any disclaimer, the term of this patent is extended or adjusted under 35 U.S.C. 154(b) by 0 days.

(21) Appl. No.: 17/020,868

(22) Filed: Sep. 15, 2020

(30) Foreign Application Priority Data

Jul. 14, 2020 (TW) .................................. 109123696

(51) Int. Cl.
*G06F 30/367* (2020.01)
*G06F 30/38* (2020.01)
*G06F 30/3308* (2020.01)
*H03K 19/20* (2006.01)
*H03K 19/21* (2006.01)

(52) U.S. Cl.
CPC ............ *G06F 30/367* (2020.01); *G06F 30/38* (2020.01); *G06F 30/3308* (2020.01); *H03K 19/20* (2013.01); *H03K 19/215* (2013.01)

(58) Field of Classification Search
CPC .... G06F 30/367; G06F 30/38; G06F 30/3308; H03K 19/20; H03K 19/215
USPC ............................ 716/107, 111, 136; 703/16
See application file for complete search history.

(56) References Cited

U.S. PATENT DOCUMENTS

| | | | |
|---|---|---|---|
| 6,560,572 B1 * | 5/2003 | Balaram | G06F 30/367 703/22 |
| 7,134,105 B2 | 11/2006 | Singh et al. | |
| 10,095,821 B1 * | 10/2018 | Lin | G06F 30/367 |
| 2011/0083114 A1 * | 4/2011 | Chetput | G06F 30/33 716/106 |
| 2015/0178428 A1 * | 6/2015 | Anand | G06F 30/367 703/13 |
| 2015/0234960 A1 * | 8/2015 | Schubert | H03M 3/30 703/14 |

OTHER PUBLICATIONS

Lubaszewski et al., "Test and Design-for-test of Mixed-Signal Integrated Circuits", Jan. 2004, https://link.springer.com/content/pdf/10.1007%2F1-4020-8159-6_7.pdf, pp. 183-212. (Year: 2004).*

* cited by examiner

*Primary Examiner* — Phallaka Kik
(74) *Attorney, Agent, or Firm* — WPAT, PC

(57) ABSTRACT

A processing method for applying an analog dynamic circuit to a digital testing tool includes the following steps. In a step (a), a transistor-level analog dynamic circuit is provided. In a step (b), plural equivalent models are designed according to operations of plural transistors in the transistor-level analog dynamic circuit. In a step (c), a substitution operation is performed to substitute the equivalent models for dynamic logic elements in the transistor-level analog dynamic circuit. Consequently, a gate-level substitution circuit is produced. In a step (d), the gate-level substitution circuit is imported into a digital testing tool. Consequently, a test pattern is generated. In a step (e), the transistor-level analog dynamic circuit is tested according to the test pattern.

8 Claims, 5 Drawing Sheets

PROCESSING METHOD FOR APPLYING ANALOG DYNAMIC CIRCUIT TO DIGITAL TESTING TOOL

This application claims the benefit of Taiwanese Patent Application No. 109123696, filed Jul. 14, 2020, the subject matter of which is incorporated herein by reference.

FIELD OF THE INVENTION

The present invention relates to an application method of an integrated circuit testing tool, and more particularly to a processing method for applying an analog dynamic circuit to a digital testing tool.

BACKGROUND OF THE INVENTION

Among integrated circuits, dynamic circuits have many advantages. For example, the dynamic circuit is operated at a faster speed, the area saving efficacy is higher, and the energy consumption is lower. Consequently, the dynamic circuits have been designed in central processing units (CPU) or application-specific integrated circuits (ASIC). In comparison with the dynamic circuits, static circuits have better noise immunity. However, static circuits have the disadvantages of larger area and slower speed.

The difference between the dynamic circuit and the static circuit is that the dynamic circuit is operated according to clock signals and the static circuit is not operated according to clock signals.

The static circuit is a static combination logic circuit composed of various static logic elements. For example, the static logic elements include NOT gates, AND gates, NAND gates, OR gates, NOR gates, XOR gate, or the like.

The dynamic circuit is a dynamic combination logic circuit composed of various dynamic logic elements. For example, the dynamic logic elements include dynamic NOT gates, dynamic AND gates, dynamic NAND gates, dynamic OR gates, dynamic NOR gates, dynamic XOR gates, or the like.

In the actual circuit design, the static circuit is represented by a higher level (e.g., a gate level), and the dynamic circuit is represented by a lower level (e.g., a transistor level). The reasons will be described as follows.

FIG. 1A is a schematic circuit diagram illustrating a static circuit. The static circuit is a one-bit static half adder. As shown in FIG. 1A, the static half adder 110 comprises an XOR gate 112 and an AND gate 114. The two input terminals of the XOR gate 112 receive a first input signal A and a second input signal B, respectively. The output terminal of the XOR gate 112 generates a sum signal S. The two input terminals of the AND gate 114 receive the first input signal A and the second input signal B, respectively. The output terminal of the AND gate 114 generates a carry signal C.

The static half adder 110 adds the first signal A and the second signal B, and generate the sum signal S and the carry signal C. For example, if the first signal A and the second signal B are both "0", the sum signal S and the carry signal C are both "0". If the first signal A and the second signal B are "1,0" or "0,1", the sum signal S is "1" and the carry signal C is "0". If the first signal A and the second signal B are both "1", the sum signal S is "0" and the carry signal C is "1". The value "1" denotes a logic high level. The value "0" denotes a logic low level.

FIG. 1B is a schematic circuit diagram illustrating a dynamic circuit. The dynamic circuit is a one-bit dynamic half adder. The dynamic half adder 120 comprises transistors a1~a8, transistors b1~b6 and a transistor c1. The transistors a1~a8 and the transistor c1 are combined as a dynamic XOR gate. The transistors b1~b6 and the transistor c1 are combined as a dynamic AND gate. Moreover, the transistors a1 and c1 of the dynamic XOR gate are controlled according to a clock signal CLK, and the transistors b1 and c1 of the dynamic AND gate are controlled according to a clock signal CLK. In other words, the dynamic half adder 120 receives the clock signal CLK, the first signal A, and the second signal B, and generates the sum signal S and the carry signal C.

If the clock signal CLK is in a logic low level (e.g., a ground voltage GND), the dynamic half adder 120 is in a pre-charge phase. Consequently, the sum signal S and the carry signal C are maintained in the logic low level. If the clock signal CLK is in a high logic level (e.g., the supply voltage Vdd), the dynamic half adder 120 is in an evaluation phase. Meanwhile, the dynamic half adder 120 adds the first signal A and the second signal B, and generate the sum signal S and the carry signal C. The detailed operating principle are not described herein.

Generally, as the function of the circuit increases, the complexity of the circuit also increases. For example, a one-bit static full adder is composed of two one-bit static half adders and an OR gate. Obviously, there are more static logic elements in the one-bit static full adder, and the connection relationship is more complicated.

Similarly, there are more transistors in the one-bit dynamic full adder. Moreover, the adder designed in the central processing unit (CPU) has the circuitry structure with at least 32 bits. Consequently, it is found that the transistor in the 32-bit dynamic adder has more transistors, and the connection relationship is more complicated.

After the static circuit and the dynamic circuit are designed, testing tools are needed to verify whether the circuits can operate normally. For example, an automatic test pattern generation (ATPG) system is a digital testing tool, which can be used to generate test patterns for testing digital circuits. In other words, the ATPG system is suitable for the gate-level static circuits.

After the static circuit is designed, the static circuit can be imported into the ATPG system. This digital testing tool can generate test patterns for the input terminal, the output terminal and all internal nodes of the static circuit. Then, the test patterns can be used to test the static circuit. During the testing process, the test patterns are inputted into the static circuit. According to the results of judging whether the generated data of the internal nodes and the output terminal of the static circuit comply with the expected data, the ATPG system determines whether the static circuit is normally operated or a design error is generated. In other words, the test patterns produced by the ATPG system have good test coverage for the static circuit.

However, the dynamic circuit is an analog circuit. The on/off states of the analog dynamic circuit are controlled according to the high/low levels of the signal. Consequently, the next-stage transistor is selectively driven. Generally, the analog dynamic circuit comprises multi-drive paths, pull-up paths, pull-down paths and loops.

Since the dynamic circuit is represented by the transistor level, the dynamic circuit is not suitable for digital testing tools. Moreover, since the nodes of the analog dynamic circuit are connected with various paths or loops, the ATPG system is unable to generate the test patterns corresponding to the internal nodes of the analog dynamic circuit. When the analog dynamic circuit is imported into the ATPG system, the test coverage is very low.

SUMMARY OF THE INVENTION

An embodiment of the present invention provides a processing method for applying an analog dynamic circuit to a digital testing tool. The processing method includes the following steps. In a step (a), a transistor-level analog dynamic circuit is provided. In a step (b), plural equivalent models are designed according to operations of plural transistors in the transistor-level analog dynamic circuit. In a step (c), a substitution operation is performed to substitute the equivalent models for dynamic logic elements in the transistor-level analog dynamic circuit. Consequently, a gate-level substitution circuit is produced. In a step (d), the gate-level substitution circuit is imported into a digital testing tool. Consequently, a test pattern is generated. In a step (e), the transistor-level analog dynamic circuit is tested according to the test pattern.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As mentioned above, the conventional analog dynamic circuit cannot be applied to the digital testing tools. For overcoming the drawbacks of the conventional technologies, the present invention provides a processing method for applying an analog dynamic circuit to a digital testing tool.

In accordance with the processing method of the present invention, an equivalent model is provided to replace the dynamic logic elements in the analog dynamic circuit. Consequently, the analog dynamic circuit can be represented by the gate level. Moreover, the analog dynamic circuit can be imported into the digital testing tool to generate test patterns. During the process of testing the analog dynamic circuit, the test patterns can be applied to the analog dynamic circuit to increase the test coverage.

Figure 2:
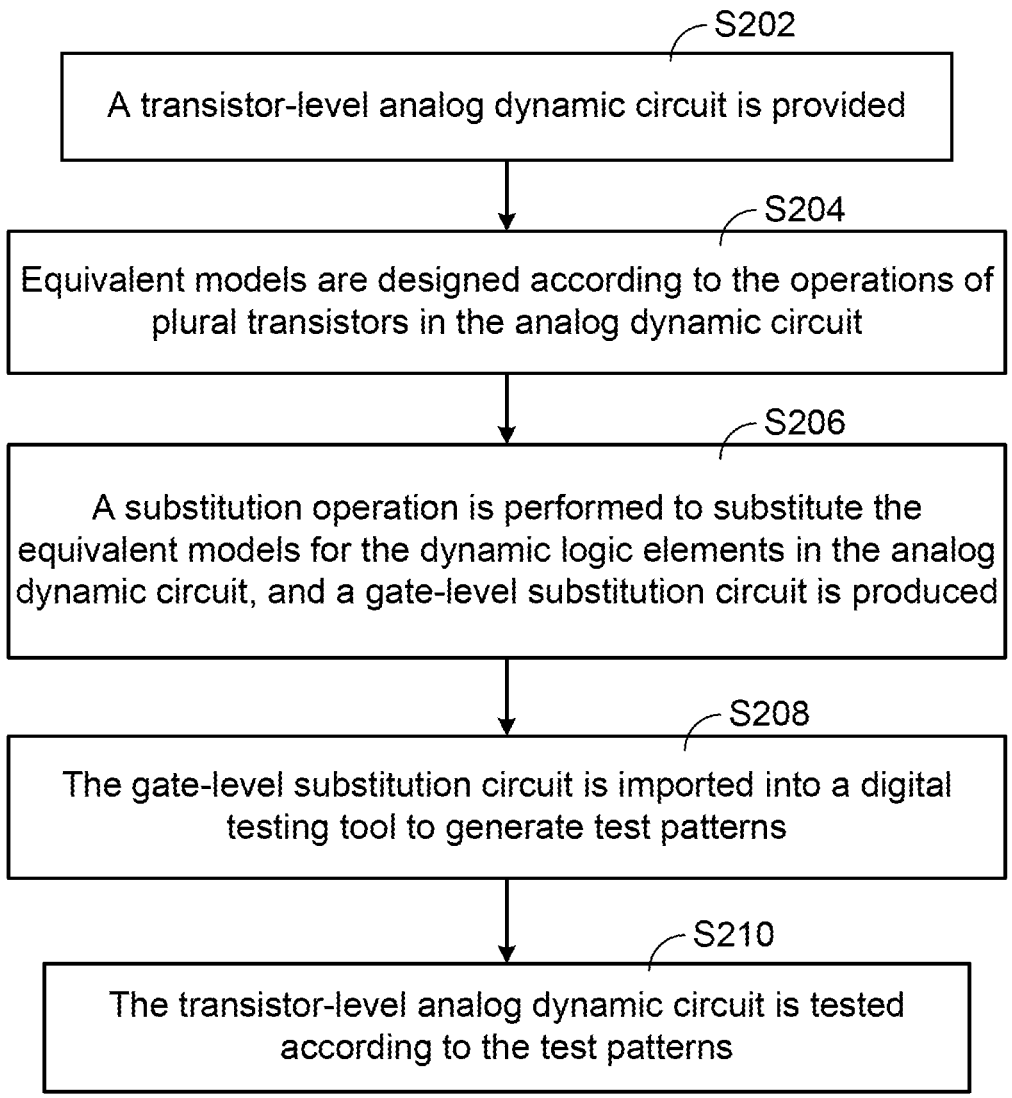
FIG. 2 is a flowchart of a processing method for applying an analog dynamic circuit to a digital testing tool.

FIG. 2 is a flowchart of a processing method for applying an analog dynamic circuit to a digital testing tool. After the analog dynamic circuit is designed, the processing method starts. Firstly, a transistor-level analog dynamic circuit is provided (Step S202).

Then, equivalent models are designed according to the operations of plural transistors in the analog dynamic circuit (Step S204). Since the analog dynamic circuit uses transistors to form various dynamic logic elements, each equivalent model can be designed for each dynamic logic element. In an embodiment, a hardware description language (HDL) is used to design the equivalent models. For example, the hardware description language Verilog is used to convert the function of a dynamic logic element into a gate-level equivalent model.

Then, a substitution operation is performed to substitute the equivalent models for the dynamic logic elements in the analog dynamic circuit, and a gate-level substitution circuit is produced (Step S206). That is, after the substitution operation is completed, the equivalent models are substituted for the corresponding dynamic logic elements in the analog dynamic circuit. Consequently, the analog dynamic circuit becomes a gate-level substitution circuit.

Then, the gate-level substitution circuit is imported into a digital testing tool to generate test patterns (Step S208). That is, the gate-level substitution circuit is imported into the ATPG system, and the test patterns for the input terminal, the output terminal and all internal nodes of the gate-level substitution circuit are generated.

After the test patterns are generated, the test patterns can be used to test the transistor-level analog dynamic circuit (Step S210). During the testing process, the test patterns are inputted into the transistor-level analog dynamic circuit, and the ATPG system judges whether the generated data of the internal nodes and the output terminal of the transistor-level analog dynamic circuit comply with the expected data. If the judging condition is satisfied, the ATPG system determines that the analog dynamic circuit is normally operated. Whereas, if the judging condition is not satisfied, the ATPG system determines that a design error of the analog dynamic circuit is generated.

By using the processing method of the present invention, the transistor-level analog dynamic circuit can be converted into the gate-level substitution circuit. After the transistor-level analog dynamic circuit is converted into the gate-level substitution circuit, the gate-level substitution circuit can be smoothly imported into the ATPG system. Consequently, the test patterns generated by the ATPG system have good test coverage for the analog dynamic circuit.

Figures 1A, 1B:
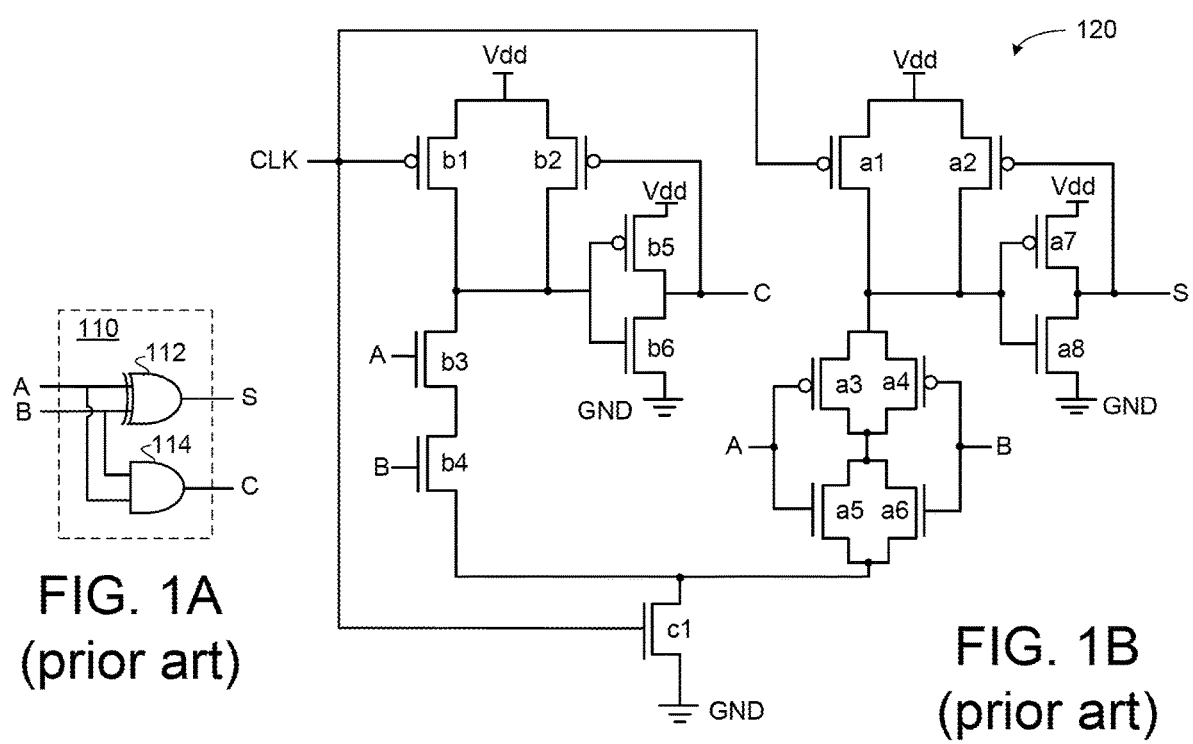
FIG. 1A (prior art) is a schematic circuit diagram illustrating a static circuit.
FIG. 1B (prior art) is a schematic circuit diagram illustrating a dynamic circuit.

For example, the processing method of the present invention is applied to the dynamic circuit as shown in FIG. 1B. The dynamic circuit is a one-bit dynamic half adder. The dynamic half adder 120 is a transistor-level analog dynamic circuit. The dynamic half adder 120 comprises the transistors a1~a8, the transistors b1~b6 and the transistor c1. The transistors a1~a8 and the transistor c1 are combined as a dynamic XOR gate. The transistors b1~b6 and the transistor c1 are combined as dynamic AND gate.

Figure 3A:
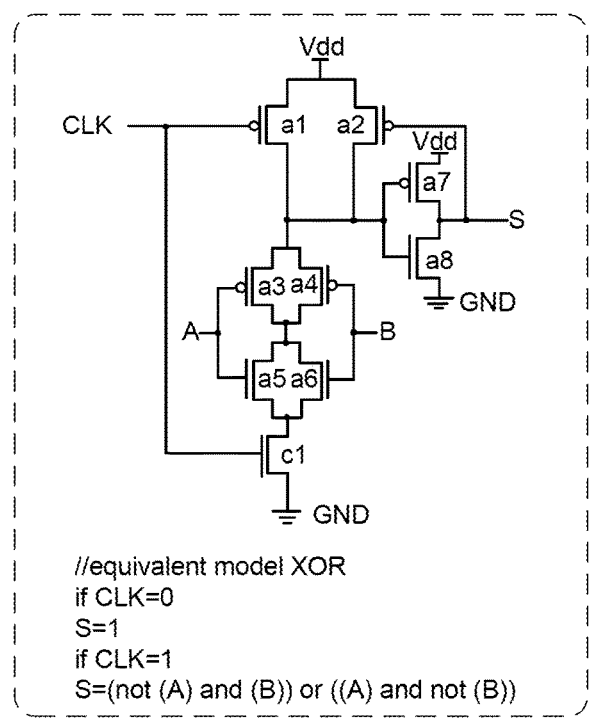
FIG. 3A schematically illustrates the circuitry structure of the dynamic XOR gate and the equivalent model.

FIG. 3A schematically illustrates the circuitry structure of the dynamic XOR gate and the equivalent model. As shown in FIG. 3A, the function of the dynamic XOR gate is further converted into the equivalent model of the dynamic XOR gate through the Verilog code. That is, the equivalent model of the dynamic XOR gate can be expressed as:

//equivalent model XOR if CLK=0
S=1
if CLK=1
S=(not (A) and (B)) or ((A) and not (B))

Figure 3B:
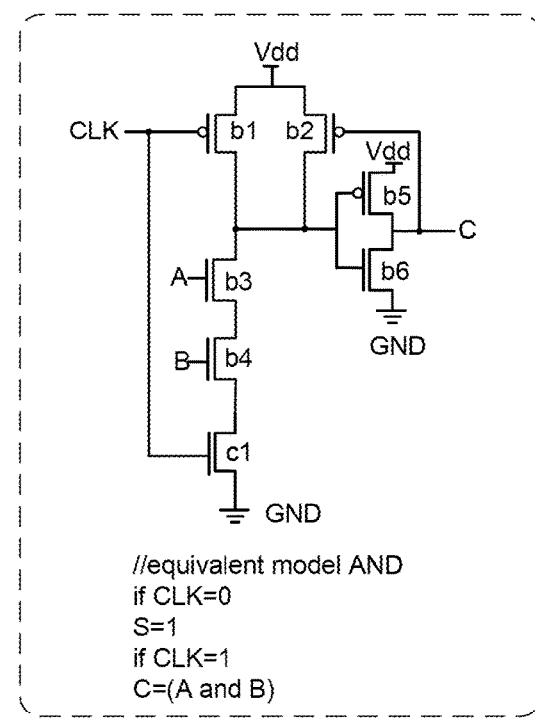
FIG. 3B schematically illustrates the circuitry structure of the dynamic AND gate and the equivalent model.

FIG. 3B schematically illustrates the circuitry structure of the dynamic AND gate and the equivalent model. As shown in FIG. 3B, the function of the dynamic AND gate is further converted into the equivalent model of the dynamic AND gate through the Verilog code. That is, the equivalent model of the dynamic AND gate can be expressed as:

//equivalent model AND
if CLK=0
C=1
if CLK=1
C=(A and B)

After the equivalent models are completed, the substitution operation is performed to substitute the equivalent model for the dynamic XOR gate and the dynamic AND gate of the one-bit dynamic half adder. Consequently, the one-bit dynamic half adder represented by the gate level is produced.

Then, the gate-level one-bit dynamic half adder is imported into the ATPG system, and the test patterns for the input terminal, the output terminal and all internal nodes of the analog dynamic circuit are generated. After the test patterns are generated, the test patterns can be used to test the one-bit dynamic half adder.

In addition to the dynamic XOR gate and the dynamic AND gate, the equivalent models corresponding to various dynamic logic elements can be previously stored in a database. While the substitution operation of the analog dynamic circuit is performed, the corresponding equivalent model is directly acquired from the database. Hereinafter, the equivalent models corresponding to some other dynamic logic elements will be described with reference to FIGS. 4A, 4B and 4C.

Figure 4A:
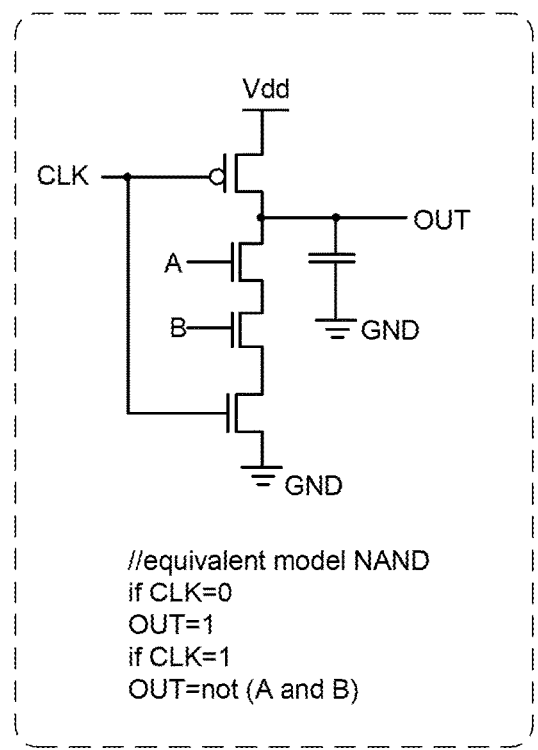
FIG. 4A schematically illustrates the circuitry structure of the dynamic NAND gate and the equivalent model.

FIG. 4A schematically illustrates the circuitry structure of the dynamic NAND gate and the equivalent model. As shown in FIG. 4A, the function of the dynamic NAND gate is further converted into the equivalent model of the dynamic NAND gate. That is, the equivalent model of the dynamic NAND gate can be expressed as:

//equivalent model NAND
if CLK=0
OUT=1
if CLK=1
OUT=not (A and B)

Figure 4B:
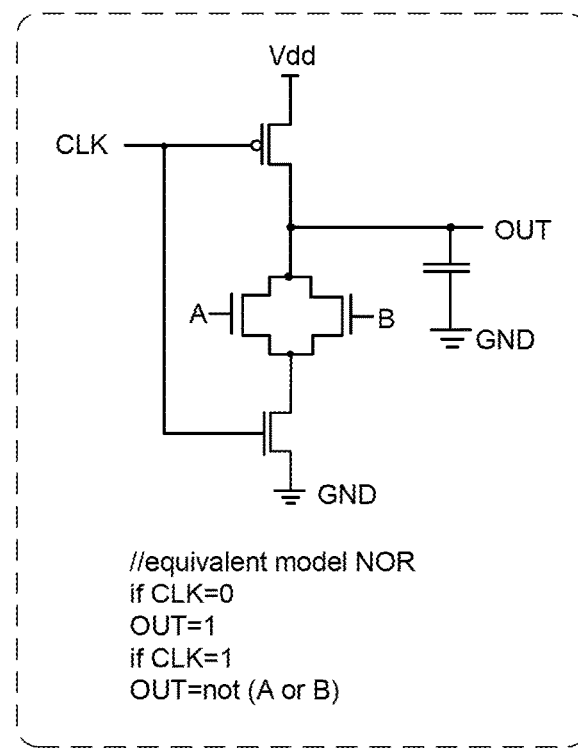
FIG. 4B schematically illustrates the circuitry structure of the dynamic NOR gate and the equivalent model.

FIG. 4B schematically illustrates the circuitry structure of the dynamic NOR gate and the equivalent model. As shown in FIG. 4B, the function of the dynamic NOR gate is further converted into the equivalent model of the dynamic NOR gate. That is, the equivalent model of the dynamic NOR gate can be expressed as:

//equivalent model NOR
if CLK=0
OUT=1
if CLK=1
OUT=not (A or B)

Figure 4C:
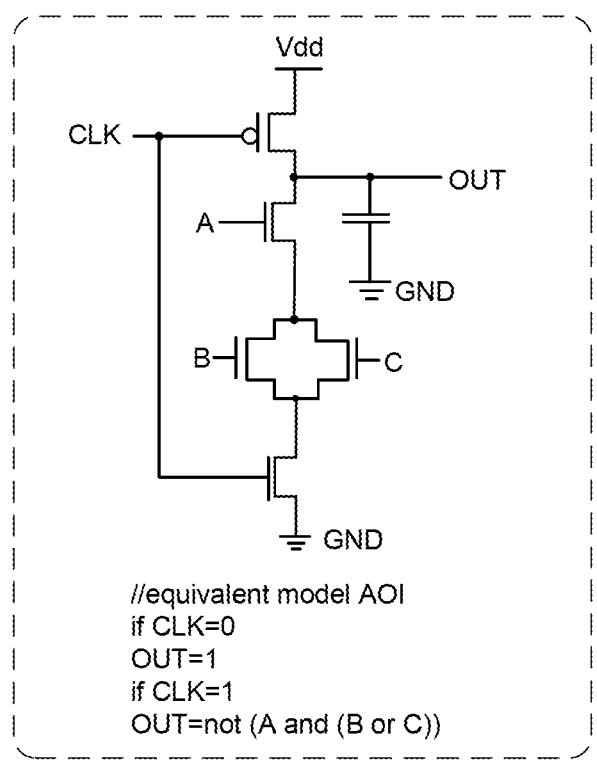
FIG. 4C schematically illustrates the circuitry structure of the dynamic AOI gate and the equivalent model.

Alternatively, the dynamic logic element is a dynamic and-or-inverter (AOI) gate. FIG. 4C schematically illustrates the circuitry structure of the dynamic AOI gate and the equivalent model. As shown in FIG. 4C, the function of the dynamic AOI gate is further converted into the equivalent model of the dynamic AOI gate. That is, the equivalent model of the dynamic AOI gate can be expressed as //equivalent model AOI
if CLK=0
OUT=1
if CLK=1
OUT=not (A and (B or C))

The examples of the equivalent models corresponding to various dynamic logic elements are not restricted. That is, the equivalent models corresponding to various dynamic logic elements may be varied according to the practical requirements. Each equivalent model has the corresponding Verilog. Moreover, each equivalent model is stored in the database.

From the above descriptions, the present invention provides a processing method for applying an analog dynamic circuit to a digital testing tool. By using the processing method of the present invention, the transistor-level analog dynamic circuit can be converted into the gate-level substitution circuit. After the transistor-level analog dynamic circuit is converted into the gate-level substitution circuit, the gate-level substitution circuit can be smoothly imported into the ATPG system. Consequently, the test patterns generated by the ATPG system have good test coverage for the analog dynamic circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A processing method for applying an analog dynamic circuit to a digital testing tool, the processing method comprising steps of:
   (a) providing a transistor-level analog dynamic circuit;
   (b) designing plural equivalent models according to operations of plural transistors in the transistor-level analog dynamic circuit;
   (c) performing a substitution operation to substitute the equivalent models for dynamic logic elements in the transistor-level analog dynamic circuit, so that a gate-level substitution circuit is produced;
   (d) importing the gate-level substitution circuit into a digital testing tool, so that a test pattern is generated; and
   (e) testing the transistor-level analog dynamic circuit according to the test pattern.

2. The processing method as claimed in claim 1, wherein the digital testing tool is an automatic test pattern generation system.

3. The processing method as claimed in claim 1, wherein the plural equivalent models are stored in a database.

4. The processing method as claimed in claim 1, wherein each equivalent model is designed through a hardware description language.

5. The processing method as claimed in claim 4, wherein the hardware description language is Verilog.

6. The processing method as claimed in claim 5, wherein each equivalent model has a corresponding Verilog code.

7. The processing method as claimed in claim 1, further comprising a step of inputting the test pattern into the transistor-level analog dynamic circuit, and judging whether the generated data of plural internal nodes and at least one output terminal of the transistor-level analog dynamic circuit comply with expected data.

8. The processing method as claimed in claim 7, wherein if the generated data of plural internal nodes and at least one output terminal of the transistor-level analog dynamic circuit comply with the expected data, it is determined that the transistor-level analog dynamic circuit is normally operated, wherein if the generated data of plural internal nodes and at least one output terminal of the transistor-level analog dynamic circuit do not comply with the expected data, it is determined that the transistor-level analog dynamic circuit has design error.

\* \* \* \* \*